United States Patent [19]
Rudi et al.

[11] Patent Number: 5,372,264
[45] Date of Patent: Dec. 13, 1994

[54] CONDUCTIVE DIVIDER FOR A TAPE CARTRIDGE MAGAZINE WITH INSERTION ERROR-PREVENTING ELEMENT

[75] Inventors: Guttorm Rudi, Fjellhammar; Halvor O. Kvifte, Haslum, both of Norway

[73] Assignee: Tandberg Data Storage, Oslo, Norway

[21] Appl. No.: 54,018

[22] Filed: Apr. 29, 1993

[51] Int. Cl.$^5$ .............................................. A47F 7/00
[52] U.S. Cl. ..................................................... 211/41
[58] Field of Search ........................... 211/41, 40, 26; 361/391, 415, 395

[56] References Cited

U.S. PATENT DOCUMENTS

| | | |
|---|---|---|
| 1,058,098 | 4/1913 | Phillips . |
| 3,561,004 | 5/1969 | Kozu . |
| 3,603,478 | 9/1971 | Connan . |
| 4,404,615 | 9/1983 | Dep . |
| 4,427,114 | 1/1984 | Howell et al. . |
| 4,655,345 | 4/1987 | Drake et al. . |
| 4,688,148 | 8/1987 | Mallory et al. ................... 211/41 X |
| 4,789,209 | 12/1988 | Teranishi . |
| 4,845,591 | 7/1989 | Pavie ................................. 211/41 X |
| 4,846,355 | 7/1989 | Price, Sr. et al. ................. 211/41 |
| 5,041,319 | 8/1991 | Becker et al. . |
| 5,103,378 | 4/1992 | Stowers et al. ................... 211/41 X |

FOREIGN PATENT DOCUMENTS 0431898  6/1991  European Pat. Off. .

*Primary Examiner*—Ramon O. Ramirez
*Assistant Examiner*—Sarah L. Purol
*Attorney, Agent, or Firm*—Hill, Steadman & Simpson

[57] ABSTRACT

A magazine containing a number of standardized magnetic tape cartridges, for loading into an automated device in which a selected cartridge can be removed from the magazine and inserted into a data reader, has a number cartridge receptacles therein formed by a number of dividers extending the width of the magazine. Each divider consists of electrically conductive polymer, and has an electrical connector at a bottom thereof which extends through a bottom of the magazine, and which engages an electrically conductive path to ground in a base element on which the magazine rests within the device, thereby providing an electrostatic discharge path for each cartridge in each receptacle. Each divider also has an element extending into the receptacle, which is engaged by the cartridge as it is being inserted into the receptacle. Based on the standardized configuration of the cartridge, the element has a profile which is configured to permit the cartridge to move over the element only when the cartridge has been inserted into the receptacle into a selected orientation. If the cartridge is attempted to be inserted into the receptacle in any other orientation, the profile prevents such insertion, thereby insuring that each cartridge will always be inserted in its receptacle in an orientation for correctly inserting the cartridge in the data reader when it is automatically removed from the magazine. For a cartridge properly oriented in the receptacle, the element also serves as a spring to urge the cartridge against a neighboring receptacle, to insure good contact with the electrostatic discharge path.

24 Claims, 3 Drawing Sheets

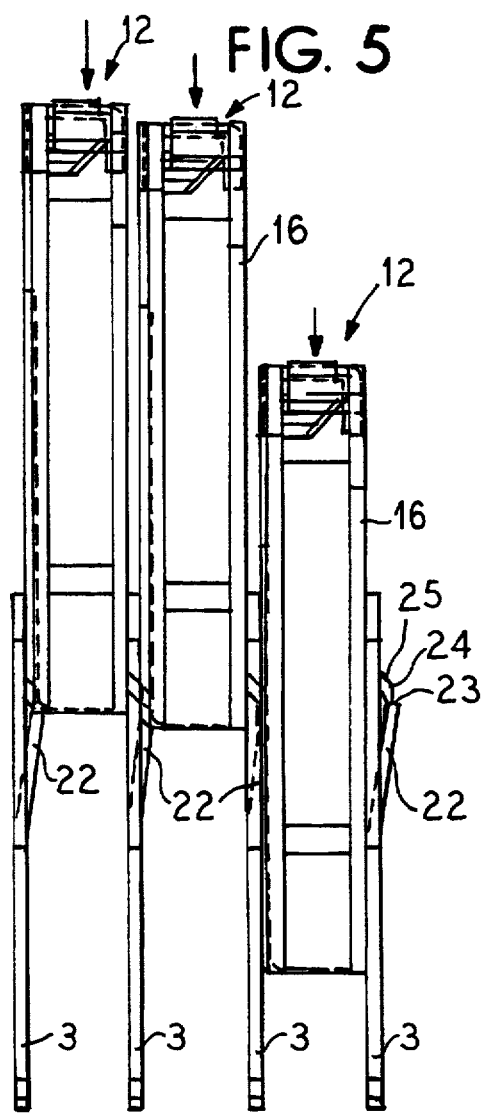
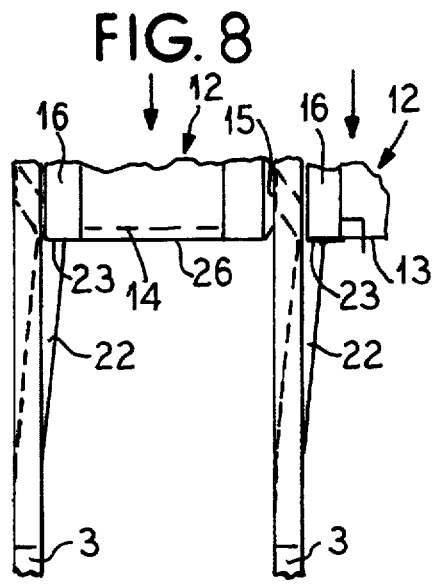
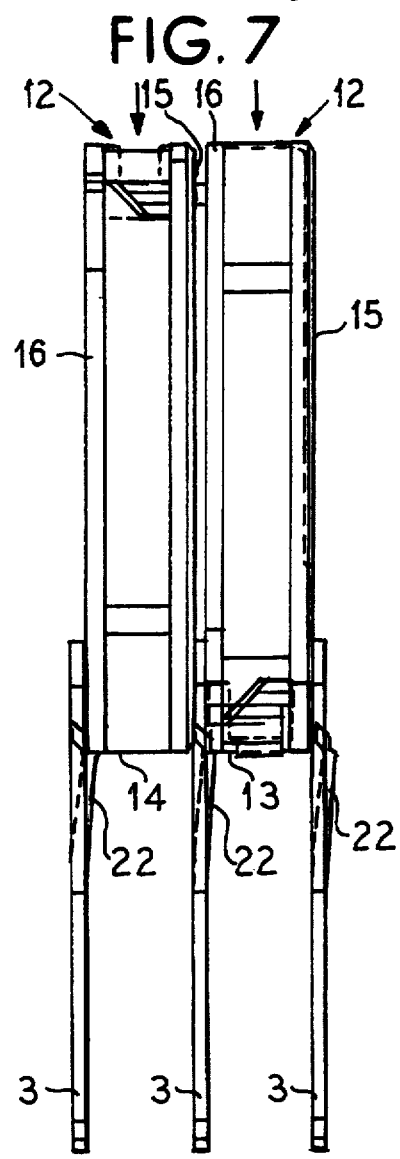
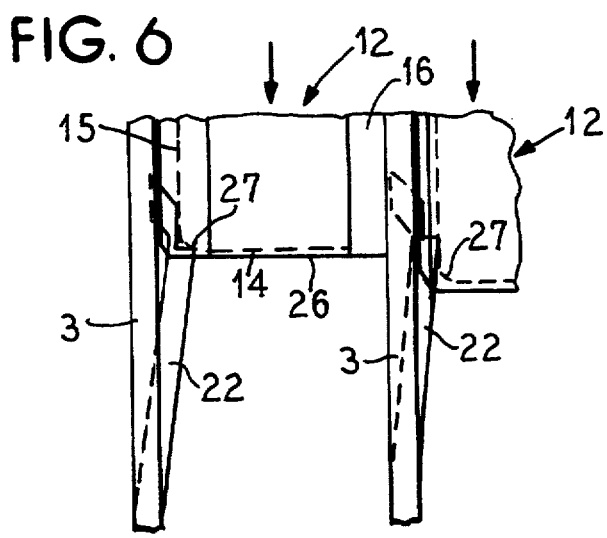

CONDUCTIVE DIVIDER FOR A TAPE CARTRIDGE MAGAZINE WITH INSERTION ERROR-PREVENTING ELEMENT

BACKGROUND OF THE INVENTION

1. Field Of the Invention

The present invention is directed to a magazine for data carriers, and in particular to a magazine for standardized magnetic tape cartridges, having a plurality of receptacles formed by a plurality of dividers.

2. Description of the Prior Art

It is known to record and store data on a number of different types of storage media, such as magnetic tape, optical disks and the like. Because of the limited size of such data carriers, the amount of data which can be stored thereon is similarly limited. In computing and data retrieval systems wherein a large amount of data is stored, a relatively large number of such data carriers are required in order to contain all of the necessary data. To retrieve the data from the clam carrier, it is necessary to insert the carder into a data reader, such as a tape drive unit. (As used herein, the unit into which the data carrier is inserted will be referred to as a "reader," although it may also be use for the purpose of writing data on the carder.)

In systems requiring multiple data carriers, it is cumbersome to manually successively insert and remove the data carriers from the reader. Many such systems, therefore, employ a data carrier magazine, which holds a large number of data carriers, with the magazine being loadable into an automated device which contains the reader. A selected data carrier can then automatically removed from the magazine, and inserted into the reader wherein the data on the carrier is read, or new data is written on the carrier. After the completion of the read or write operation, the data carrier is then automatically removed from the reader and is replaced in the magazine. The device which removes the data carrier from the magazine, inserts it in the reader, and removes it from the reader and replaces it in the magazine is generically known as a "loader."

Such data carrier magazines generally are in the form of a box-like container, which is divided into a number of receptacles for individually receiving a data carrier.

A tray-type magazine for tape cassettes is disclosed in U.S. Pat. No. 3,561,004, which has a frame with sidewalls and an open top and bottom. The sidewalls of channels therein arranged in pairs, with each pair of channels receiving a cassette therebetween. A plurality of release elements are provided in one of the sidewalls respectively at the channels therein. Each release element engages a cassette placed between the channels, and holds the cassette between the channels until actuated, so that the cassette can drop through the frame into a mechanism for transporting the cassette to a tape player.

Another holder for multiple cassettes, not intended for use as a loading magazine, is disclosed in U.S. Pat. No. 3,603,478. The interior of the case of this cassette holder has a plurality of guide ribs therein, which form channels for receiving tape cassettes. Each compartment formed by a pair of such guide ribs have a lid having a resilient element thereon which engages a side face of a cartridge when placed in the compartment. Such engagement causes the element to extend outwardly from the case when the lid is closed, providing a visual indication that a cassette is contained therein.

A compact disc storage unit having a plurality of spaced guides on a top and bottom of the unit, which form at receptacles for receiving a compact disc in its container, is disclosed in U.S. Pat. No. 4,655,345. Each receptacle has a slidable element at a bottom thereof, which can be gripped from the exterior of the storage unit to pull a compact disc in its container out of the receptacle.

It is generally desirable to maintain data carriers free of static electrical charge accumulation because such static charge, if present when the data carrier is inserted in a reader, can cause damage to sensitive parts of the reader, if a discharge occurs within the reader, and moreover can alter or obliterate the information contained on the data carrier, particularly if the information is magnetically stored on the carrier. In magnetic tape readers, for example, it is known to provide an electrostatic discharge element, connectable to ground, at the opening of the reader, which comes into contact with a data cartridge as it is inserted into the reader. This insures that any accumulated charged will be discharged to ground before the cartridge enters into the region of any sensitive components of the reader.

It is desirable to always minimize the accumulation of static charge on a data carrier, and therefore it is desirable also to provide electrostatic discharge means in a data carrier magazine.

Protective containers for sensitive electronic components, not specifically designed for data carriers, are disclosed in U.S. Pat. Nos. 4,427,114 and 4,404,615. Each container includes a plurality of dividers forming receptacles for the electronic components, and each has an electrostatic discharge path around the walls of the container.

Another type of electrostatic discharge structure is disclosed in U.S. Pat. No. 5,041,319, for use with discrete electrical components of the type having one or more leads extending from a component package, such as a dual-in-line chip. The leads are then inserted into a laminated material, such as layers of anti-static foam.

Lastly, it is a problem in data carrier magazines which are intended for loading a plurality of data carriers into a loader, to insure that the data carriers are contained within the magazine in an orientation which results in a correct insertion of the data carrier into the reader. Since the data carrier is removed from the magazine and inserted into the reader automatically, the removal and insertion sequence is designed to end with the data carrier presented to the reader in the proper orientation. For example, for a data carrier such as a magnetic tape cartridge, the cartridge must be presented for insertion into the reader in an orientation which insures that the top and bottom of the cartridge are properly oriented relative to the reader, and which also insures that the proper end of the cartridge will be inserted first into the reader. Since the removal and insertion sequence is undertaken automatically, the same sequence is always used, and cannot be changed dependent on the manner by which the cartridge happens to be oriented in the magazine. This means that the cartridge must always be inserted in the magazine at a starting orientation which, given a specified sequence of loading steps, will result in the proper orientation of the cartridge at the end of the sequence.

Since the data carriers are usually initially placed in the magazine manually, it is desirable to provide means in the magazine prevents a data cartridge from being inadvertently improperly oriented within its receptacle, and which informs the person placing the cartridges in the magazine if an attempt is made to incorrectly place a cartridge in the magazine.

SUMMARY OF THE INVENTION

It is an object of the present invention to provide a magazine for standardized magnetic tape cartridges having a plurality of receptacles formed by a plurality of walls extending the width of the magazine wherein an electrostatic discharge path is provided in the magazine for each cartridge in each receptacle.

It is a further object of the present invention to provide such a magazine for standardized tape cartridges which prevents insertion of a data cartridge in the magazine in an orientation deviating from a selected, correct orientation.

The object of providing an electrostatic discharge path in each receptacle is achieved in accordance with the principles of the present invention in a magazine have a plurality of transverse walls each consisting of electrically conductive polymer. Each wall has a connector formed by one or more prongs at a bottom thereof, which extend through openings in the bottom of the magazine. The prongs extending through the bottom of the magazine engage an electrostatic discharge path in a base element on which the magazine rests. The base element may be, for example, the bottom of a drawer in a loader in which the magazine is placed. The electrostatic discharge path in the base element may also consist of electrically conductive polymer, so that the prongs can deform, or slightly pierce, the resilient material, thereby providing a positive electrical connection.

The transverse walls may be in the form of dividers which are removably received in vertical channels in the sidewalls of the magazine.

The object of preventing erroneous insertion of a standardized tape cartridge in the magazine is achieved in accordance with the principles of the present invention by providing each transverse wall with an error preventing element, in the form of a leaf spring extending from the transverse wall into the receptacle, so that the element intercepts a tape cartridge as it is being inserted into the receptacle. Standardized tape cartridges have a unique configuration, which is known and which is the same for all cartridges. The insertion error-preventing element has a profile with a shape which engages an edge or corner of the tape cartridge. When the tape cartridge is correctly inserted into the receptacle, it will always present a curved edge or corner to the profile, and the profile will slide out of the insertion path of the cartridge, due to this curved edge, thereby permitting the cartridge to pass by the element and be completely inserted in the receptacle. Attempted insertion of the cartridge into the receptacle in any other insertion will present a sharp edge or corner to the profile, which will be "caught" by the profile, and since the profile extends into the insertion path, further insertion of the cartridge into the receptacle will be prevented, thereby informing the person attempting such insertion that the cartridge must be re-oriented.

Although heretofore described separately, the objects of providing an electrostatic discharge path and preventing erroneous insertion of the cartridge cooperate by means of the error preventing element. Since the error preventing element is normally biased, such as in the form of a leaf spring, to protrude into the receptacle, the element will be urged against a properly inserted cartridge in the receptacle after the leading edge of the cartridge has passed by the element. The element will thereby urge the cartridge against the transverse wall on the other side of the cartridge, thereby insuring positive electrical connections to the electrostatic discharge paths on either side of the cartridge in the receptacle.

DESCRIPTION OF THE DRAWINGS

FIG. 5 is a side elevational view of a series of dividers constructed in accordance with the principles of the present invention, with the magazine omitted, showing a sequence of standardized magnetic tape cartridge being inserted in the receptacles formed by the dividers in a correct manner.

FIG. 6 is an enlargement of a portion of FIG. 5, showing the details of the insertion error-preventing element with a correctly inserted standardized magnetic tape cartridge.

FIG. 7 is side elevational view of a series of dividers constructed in accordance with the principles invention, with the magazine omitted, showing two standardized magnetic tape cartridges in respectively different incorrect orientations relative to the receptacles.

FIG. 8 is an enlargement of a portion of FIG. 7, showing the insertion error-preventing element engaging the incorrectly inserted standardized magnetic tape cartridges.

DESCRIPTION OF THE PREFERRED EMBODIMENTS

Figure 1:
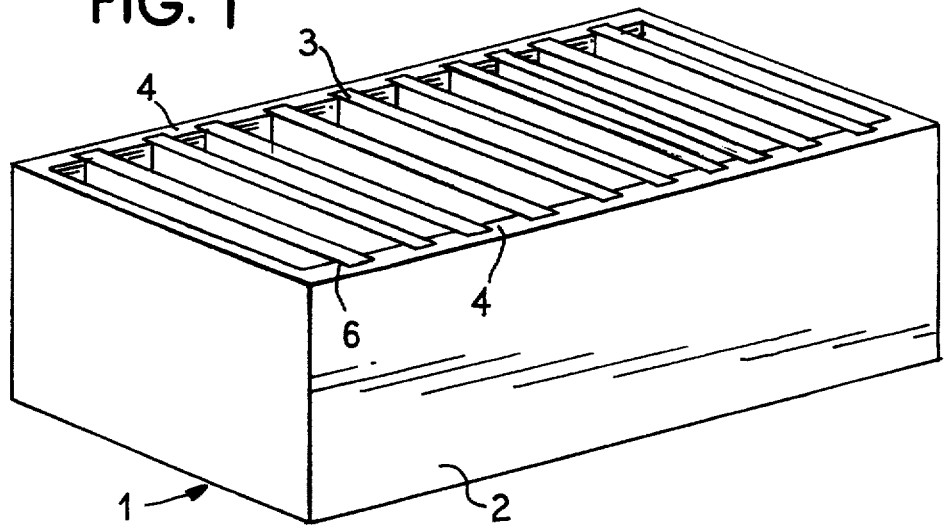
FIG. 1 is a perspective view of a magazine for standardized magnetic tape cartridges having a plurality of dividers therein constructed in accordance with the principles of the present invention.

A simplified depiction of a magazine for a plurality of data carriers, such as a plurality of standardized magnetic tape cartridges, is shown in FIG. 1. The magazine 1 has a box-like container 2 having a plurality of transverse walls formed by dividers 3 therein, which extend the width of the container 2 in a direction perpendicular to a longitudinal length of the container 2. The dividers 3 are received in respective opposed pairs of channels 6 in sidewalls 4 of the container 2, each divider 3 sliding vertically into a pair of channels 6 so that the bottom of the divider 3 rests against the bottom 5 of the container 2, as shown in FIGS. 2 and 3.

Figure 2:
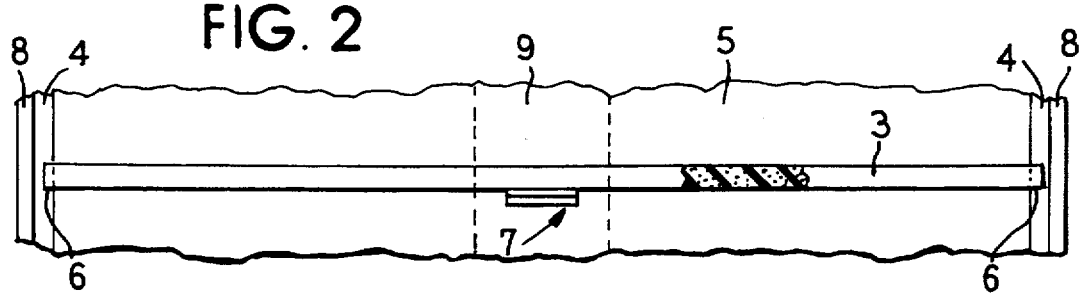
FIG. 2 is a plan view of one of the dividers in the magazine of FIG. 1, shown partly in section.
Figure 3:
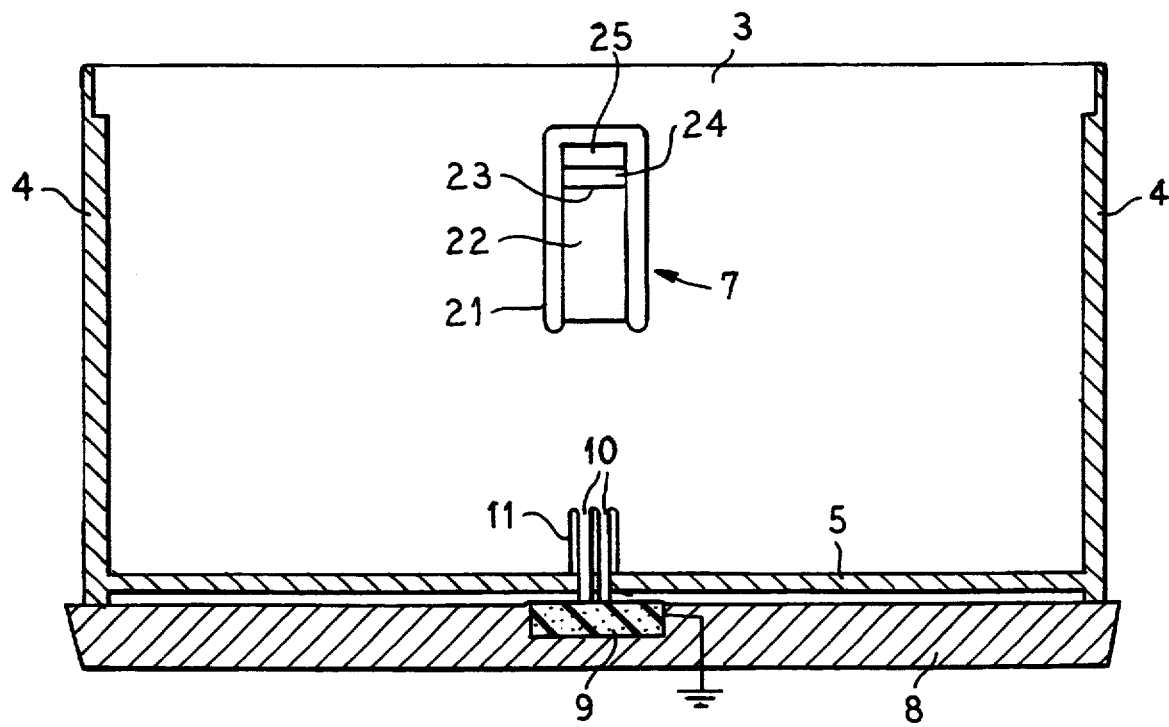
FIG. 3 is an end elevational view of the divider of FIG. 2, with the magazine and a base element shown in section.

As also shown in FIGS. 2 and 3, each divider 3 has a pair of projections at an upper region thereof, which are received in the channels 6. The channels 6 may continue along the entire height of each sidewall 4 at a reduced depth to receive the remainder of each side of the divider 3.

Each divider 3 has an insertion error-preventing element 7 formed therein, described in more detail below, which permits insertion of a standardized magnetic tape cartridge into a receptacle, of which the divider 3 forms one wall, only in a selected orientation. Attempted insertion of the standardized cartridge in any other orientation is prevented by the element 7.

As shown in FIG. 2, the divider 3 consists of electrically conductive polymer, such as plastic or rubber. The divider 3 thus forms a part of an electrostatic discharge path to ground, for discharging accumulated static charge on a data carrier contained in the receptacle partially formed by the divider 3. The remainder of the electrostatic discharge path is formed by a strip 9 connected to ground and contained in a base element 8. The base element 8 may be a component of a device in which the magazine 1 is placed for removing selected data carriers from the magazine and successively inserting them into a data reader. For example, the base element 8 may be a bottom of drawer in such a device in which the magazine is placed. The strip 9 also consists of electrically conductive polymer, such as plastic or rubber, or any type of conductive, elastically deformable material, and is in contact with a connector formed by downwardly extending prongs 10 of the divider 3. The prongs 10 are integrally formed at a bottom of the divider 3 in a recess 11 therein. The prongs 10 extend through an opening in the bottom 5 of the container 2 so as to press against the resilient strip 9. When a data carrier is contained in a receptacle of which the divider 3 forms one wall, the data carrier will be in contact with the divider 3. Any accumulated charge on the data carrier can then be discharged to ground via the main body of the divider 3, the prongs 10, and the strip 9. Preferably, the magazine 1 will be orientated on the base element 8 so that the resilient strip 9 is parallel to the longitudinal extent of the magazine 1. Each divider 3 in the magazine 1 is constructed identically to the divider shown in FIGS. 2 and 3, and the container bottom 5 has a series of openings in registry with the strip 9, and thus each receptacle with have a path to ground.

Figure 4:
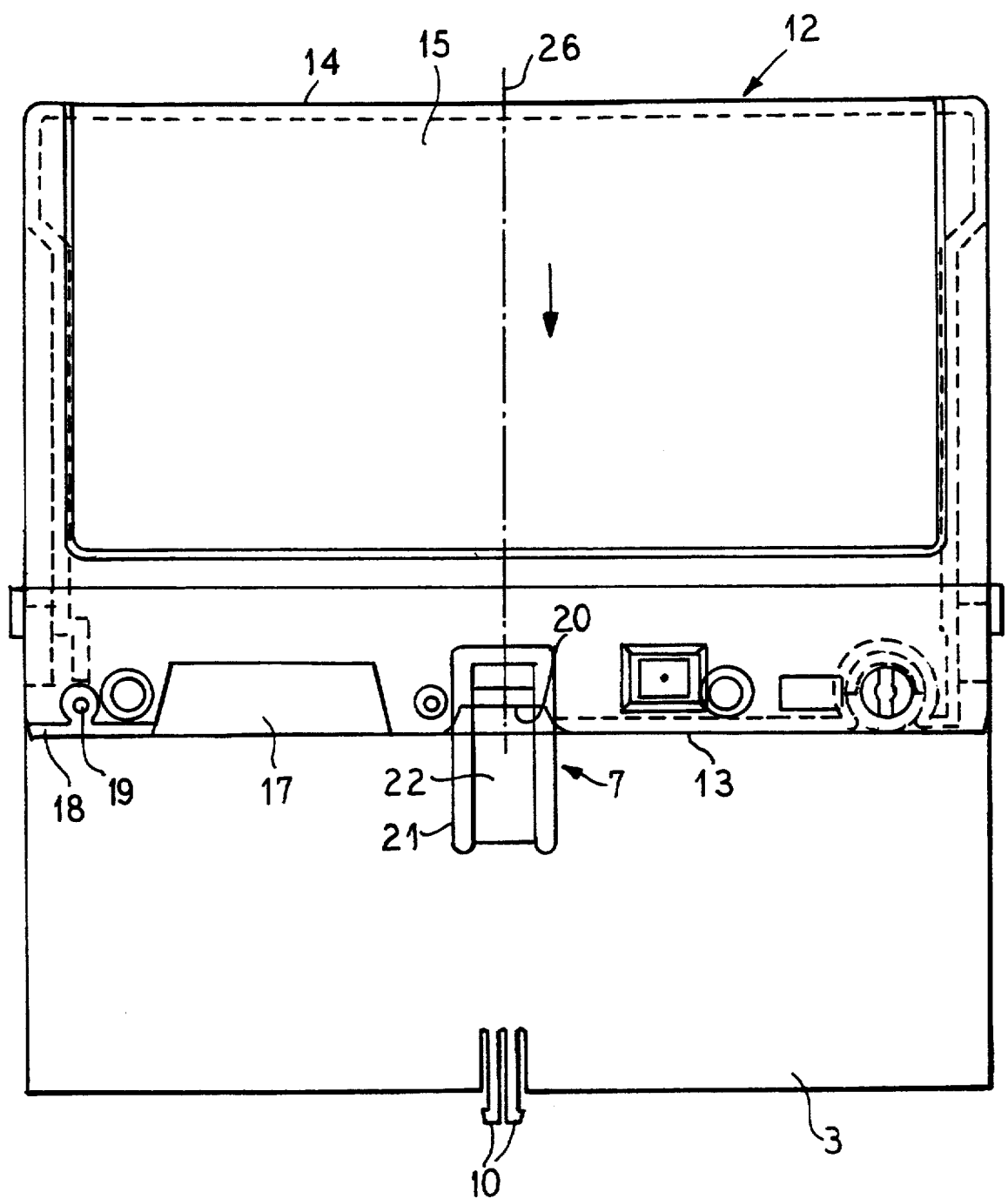
FIG. 4 is an end elevational view of a divider constructed in accordance with the principles of the present invention, with the surrounding magazine omitted, with a standardized magnetic tape cartridge being inserted in an incorrect orientation in a receptacle of which the divider forms one wall.

A standardized magnetic tape cartridge 12, such as a quarter-inch cartridge, has a known, standardized outer package configuration as shown in top plan view in FIG. 4, and in side views in FIGS. 5 and 7. The cartridge 12 has a front face 13, a rear face 14, a top 15, and a bottom 16. Typically, the bottom 16 consists of metal, and the remainder of the package consists of plastic. The front face 13 of the cartridge 12 has an opening therein, which is normally closed by a dust cover 17, behind which the magnetic tape in the cartridge 12 is disposed. When the cartridge 12 is to be inserted into a tape drive for writing data on the tape or reading data from the tape, a flap 18 is actuated by an dement in the drive, causing the door 17 to pivot around an axle 19 to expose the magnetic tape for contact with a write/read head. The door 17 is normally biased by a spring (not shown) to the closed position shown in FIG. 4.

The magazine 1 is intended for use in a loader of the type wherein a data reader is moved over the magazine, which is stationary, to a position above a selected magnetic tape cartridge in one of the receptacles in the magazine 1. A loading mechanism (not shown) lifts a magnetic tape cartridge upwardly out of the receptacle, and inserts it into the reader. The sequence is then reversed when the magnetic tape cartridge is removed from the data reader and replaced in its receptacle in the magazine 1. It is thus important that the magnetic tape cartridge 12 always be properly placed in the receptacle in the magazine 1 in an orientation which presents the dust cover 17 at a proper position so that it can be opened when inserted into the data reader, and so that the write/read head will then be positioned against the magnetic tape behind the dust cover 17. The insertion error preventing element 7 is designed to permit insertion of a magnetic tape cartridge 12 in a receptacle in the magazine 1 in an orientation which insures that the front face 13 will always be disposed at the open top of the receptacle, i.e., so that the cartridge can only be completely received within a receptacle with the rear face 14 thereof next to the bottom 5 of the container 2, and also such that the dust cover 17 will be disposed closest to a selected one of the sidewalls 4 of the magazine 1. The exterior of the magazine 1 will have a unique configuration (not shown in the drawings) which will permit insertion of the magazine 1 into the loader only in one orientation, such as by chamfering an exterior edge of the container 2, and since the divider disclosed herein permits orientation of the cartridges 12 in the magazine 1 only in a single, correct orientation, this insures that the tape cartridges 12 will always be oriented properly for correct insertion in the data reader.

For this purpose, the element 7 has a profile formed by its surfaces which permits passage of only one, unique edge of the cartridge 12 past the element 7, but catches or blocks every other edge of the cartridge 12, preventing the cartridge 12 in orientations which present those other edges to the element from passing by the element 7. Presentation of the unique edge of the cartridge 12 which can pass the profile on the element 7 corresponds to a proper orientation of the cartridge 12 in a receptacle, and thus the cartridge 12 can be completely inserted in a receptacle only with this proper orientation.

The insertion error-prevention element 7 is in the form of a leaf spring 22 which is cut out of a central opening 21 in the divider 3. The spring 22 is resiliently hinged at the region where it is connected to the remainder of the divider 3 so as to normally project slightly into a receptacle of the magazine 1, of which the divider 3 forms one wall. The profile on the spring 22, as shown in FIGS. 3, 6 and 8, is formed by a horizontal surface 23, a vertical surface 24, and an inclined surface 25. These surfaces extend across the width of the free end of the spring 22.

As shown in FIGS. 5 and 6, the rear face 14 joins the top 15 of the standardized cartridge 12 at a rounded edge or comer 27. This rounded edge or corner 27 is present in all standardized cartridges 12. When the cartridge 12 is inserted into a receptacle formed between successive dividers 3, the rounded edge 27 presented by the leading face of the cartridge 12 slides over the edges presented by the horizontal surface 23 and the vertical surface 24 of the spring 22, and after passing by those surfaces, the spring 22 is forced by the inclined surface 25 out of the way of the cartridge 12, thereby permitting the cartridge 12 to be completely inserted in the receptacle. As shown in the enlarged portion of FIG. 6, each lateral side of the cartridge 12 has a raised portions 26, however, these portions 26 do not extend into the central portion of the cartridge 12, and thus do not come into contact with the element 7. Every other orientation of the standardized cartridge 12 presents a sharp, angled comer to the free end of the spring 22, and is thereby caught or engaged by the spring 22, so that further insertion of the cartridge 12 into the receptacle is prevented. This is described below for the other three possible (incorrect) orientations of the cartridge 12.

As shown in FIG. 4, the front face 13 of the cartridge 12 has an opening 20 therein through which the capstan roller (not shown) is exposed for engagement with the drive motor in the data reader into which the cartridge 12 is to be inserted. This receptacle 20 is always disposed centrally in the front face 13 of the cartridge 12. Since the element 7 is also disposed centrally relative to the divider 3, if the cartridge 12 is attempted to be inserted with the front face 13 first, with the top 15 adjacent the divider 3, the edge of the opening 20 will be caught by the corner formed by the horizontal surface 23 and the vertical surface 24, and further insertion of the cartridge 12 in the receptacle will be prevented.

If the cartridge 12 is attempted to be inserted in a receptacle with the bottom 16 thereof adjacent the divider 3, with either the front face 13 or the rear face 14 first, the bottom 16 presents a sharp corner to the free end of the spring 22, which is again caught by the surfaces 23 and 24, and further insertion of the cartridge 12 in the receptacle is prevented, as shown in FIGS. 7 and 8.

Therefore, only one orientation of the cartridge 12 is permitted by the element 7, namely with the top 15 of the cartridge 12 adjacent the divider 3 and with the rear face 14 inserted first, as the leading face.

As noted earlier, and as can be seen in FIG. 6, after the cartridge 12 passes by the spring 22, the spring 22 still extends slightly into the receptacle, and urges the cartridge 12 tightly against the next divider 3. This insures positive electrical contact for completing the aforementioned electrostatic discharge path.

Although modifications and changes may be suggested by those skilled in the art, it is the intention of the inventors to embody within the patent warranted hereon all changes and modifications as reasonably and properly come into the scope of their contribution to the art.

We claim as our invention:

1. A holder for a data carrier subject to accumulation of static electrical charge thereon, said holder being for use with a base element on which said holder rests, said base element having an exposed path to ground, said holder comprising:
   a container having a bottom and plurality of walls forming at least one receptacle adapted for receiving a data carrier;
   at least one of said walls forming said receptacle consisting of electrically conductive polymer and being disposed for contacting a data carrier in said receptacle, and having an electrical connector projecting from a bottom thereof; and
   said bottom of said container having an opening therein disposed above said exposed path to ground when said holder rests on said base element and disposed in registry with said electrical connector, said electrical connector projecting through said opening into mechanical and electrical contact with said exposed path to ground to form an electrostatic discharge path through said electrically conductive polymer to said path to ground.

2. A holder as claimed in claim 1, for use with a base element wherein said exposed path to ground consists of resilient, electrically conductive material, and wherein said electrical connector comprises at least one prong projecting a distance from a recess in said bottom of said one of said walls for engaging said resilient, electrically conductive material and deforming said resilient, electrically conductive material to make said electrical and mechanical contact.

3. A holder as claimed in claim 1, wherein said container has a pair of sidewalls with channels therein extending vertically from said bottom of said container, each channel in one sidewall being in registry with a channel in the other sidewall and thereby forming a plurality of channel pairs, and wherein said walls forming said receptacle each consist of a divider, separable from said container, and received in a channel pair.

4. A holder as claimed in claim 1, wherein said one of said walls consists of electrically conductive plastic.

5. A holder as claimed in claim 1, wherein said one of said walls consists of electrically conductive rubber.

6. A holder for a plurality of data carriers subject to accumulation of static electrical charge thereon, said holder for use with a base element on which said holder rests, said base element having an exposed path to ground, said holder comprising:
   a container having sidewalls joined at opposite ends by end walls, and a bottom, said container having a plurality of transverse walls therein forming a plurality of receptacles each adapted to receive a data carrier;
   each of said transverse walls consisting of electrically conductive polymer and being disposed for contacting a data carrier in said receptacle, and having an electrical connector projecting from a bottom thereof; and
   said bottom having a plurality of openings therein in registry with said respective electrical connectors projecting from said transverse walls and disposed above said exposed path to ground for receiving said electrical connectors in said openings to permit said electrical connectors to extend therethrough into mechanical and electrical contact with said exposed path to ground to complete an electrostatic discharge path from said electrically conductive polymer to said path to ground.

7. A holder as claimed in claim 6, for use with a base element wherein said exposed path to ground consists of resilient, electrically conductive material, and wherein said electrical connector comprises at least one prong projecting a distance from a recess in said bottom of said one of said walls for engaging said resilient, electrically conductive material and deforming said resilient, electrically conductive material to make said electrical and mechanical contact.

8. A holder as claimed in claim 1, wherein said sidewalls each have a plurality of channels therein extending vertically from said base, each channel in a sidewall being in registry with a channel in the other sidewall and thereby forming a plurality of channel pairs, and wherein said transverse walls consist of a plurality of dividers respectively removably received in said channel pairs.

9. A holder as claimed in claim 6, wherein said transverse walls consist of electrically conductive plastic.

10. A holder for data carriers having a plurality of walls for separating data carriers in the holder, said walls consisting of electrically conductive rubber.

11. A holder for removably receiving a data carrier which insures a selected orientation of said data carrier upon insertion thereof in said holder, said holder for use with a data carrier having a face with an edge having a unique shape, said holder comprising:

a plurality of walls forming a receptacle adapted for receiving said data carrier;

an insertion error-preventing element carried by one of said walls at a location for engaging said data carrier upon insertion of said data carrier in said receptacle along an insertion path; and said insertion error-preventing element including a leaf spring extending from said one of said walls into said receptacle and having a free end with a profile permitting only said edge having a unique shade to pass said free end, by displacing said leaf spring out of said insertion path.

12. A holder as claimed in claim 11, for use with a data carrier having a face with a transverse edge having a unique shape, and wherein said one of said walls comprises a transverse wall of said receptacle.

13. A holder as claimed in claim 11, for use with a data carrier having only one curved edge, forming said edge having a unique shape, and a plurality of cornered edges, and wherein said profile at said free end of said leaf spring comprises a horizontal surface and a vertical surface which catch and prevent passage of said cornered edges and which permit passage of said curved edge.

14. A holder as claimed in claim 11, wherein said plurality of walls include sidewalls each having a channel therein, said channels being in registry, and a transverse wall removably received in said channels.

15. A holder as claimed in claim 14, wherein said transverse wall forms said one of said walls carrying said insertion error-preventing element.

16. A holder for removably receiving a plurality of data carriers which insures a selected orientation of each data carrier upon insertion thereof in said holder, each data carrier having a face with an edge having a unique shape, said holder comprising:

a container having a pair of sidewalls joined by end walls and a bottom;

a plurality of transverse walls extending between said sidewalls in said container and forming a plurality of receptacles each adapted to receive a data carrier therein, each transverse wall carrying an insertion error-preventing element at a location for engaging said data carrier upon insertion in a receptacle along an insertion path; and each insertion error-preventing element including a leaf spring extending from the transverse wall on which said insertion error-preventing element is carried into one of said receptacles, and having a free end with a profile permitting only said edge having a unique shade to pass said free end, by displacing said leaf spring out of said insertion path.

17. A holder as claimed in claim 16, for use with a data carrier having only one curved edge, forming said edge having a unique shape, and a plurality of cornered edges, and wherein said profile at said free end of said leaf spring comprises a horizontal surface and a vertical surface which catch and prevent passage of said cornered edges and which permit passage of said curved edge.

18. A holder as claimed in claim 16, wherein said sidewalls each have a plurality of channels therein, extending vertically from said base, each channel in a side wall being in registry with a channel in the other sidewall and thereby forming a plurality of channel pairs, and wherein said transverse walls consist of a plurality of dividers respectively removably received in said channel pairs.

19. A holder for a plurality of data carriers which insures a selected orientation of each data carrier upon insertion thereof in said holder, each data carrier having a face with an edge having a unique shape and each data carrier being subject to accumulation of static electrical charge thereon, said holder being for use with a base element on which said holder rests, said base element having an exposed path to ground, said holder comprising:

a container having a pair of sidewalls joined by end walls, and a bottom;

a plurality of transverse walls extending between said sidewalls in said container and forming a plurality of receptacles, each adapted to receive a data carrier therein in contact with at least one of said transverse walls, each transverse wall consisting of electrically conductive polymer and having an electrical connector projecting from a bottom thereof and an insertion error-preventing element at a location for engaging said data carrier upon insertion in a receptacle along an insertion path;

said bottom of said container having an opening therein disposed above said exposed path to ground when said holder rests on said base element and disposed in registry with said electrical connector, said electrical connector projecting through said opening into mechanical and electrical contact with said exposed path to ground to form an electrostatic discharge path through said electrically conductive polymer to said path to ground; and each insertion error-preventing element including a leaf spring extending from the transverse wall on which said insertion error-preventing element is carried into one of said receptacles, and having a free end with a profile permitting only said edge having a unique shape to pass said free end, by displacing said leaf spring out of said insertion path.

20. A holder has claimed in claim 19, for use with a base element wherein said exposed path to ground consists of resilient, electrically conductive material, and wherein said electrical connector comprises at least one prong projecting a distance from a recess in said bottom of said transverse wall for engaging said resilient, electrically conductive material and deforming said resilient, electrically conductive material to make said electrical and mechanical contact.

21. A holder as claimed in claim 19, wherein said sidewalls have a plurality of channels therein extending vertically from said bottom of said container, each channel in one side wall being in registry in a channel in the other sidewall and thereby forming a plurality of channel pairs, and wherein said transverse walls consist of a plurality of dividers respectively removably received in said channel pairs.

22. A holder as claimed in claim 19 wherein said transverse walls consist of electrically conductive plastic.

23. A holder as claimed in claim 19, wherein said transverse walls consist of electrically conductive rubber.

24. A holder as claimed in claim 19, for use with a data carrier having only one curved edge, forming said edge having a unique shape, and a plurality of cornered edges, and wherein said profile at said free end of said leaf spring comprises a horizontal surface and a vertical surface which catch and prevent passage of said cornered edges and which permit passage of said curved edge.

* * * * *